US008389130B2

(12) United States Patent
Grizzi et al.

(10) Patent No.: US 8,389,130 B2
(45) Date of Patent: Mar. 5, 2013

(54) OPTO-ELECTRICAL POLYMERS AND DEVICES

(75) Inventors: Ilaria Grizzi, Cambridge (GB); Carl R. Towns, Cambridgeshire (GB); Caroline Towns, legal representative, Suffolk (GB); Natasha Conway, Histon (GB)

(73) Assignee: CDT Oxford Limited, Cambridgeshire (GB)

( * ) Notice: Subject to any disclaimer, the term of this patent is extended or adjusted under 35 U.S.C. 154(b) by 551 days.

(21) Appl. No.: 12/298,239

(22) PCT Filed: Apr. 19, 2007

(86) PCT No.: PCT/GB2007/001420
§ 371 (c)(1),
(2), (4) Date: Feb. 24, 2009

(87) PCT Pub. No.: WO2007/129015
PCT Pub. Date: Nov. 15, 2007

(65) Prior Publication Data
US 2009/0322213 A1  Dec. 31, 2009

(30) Foreign Application Priority Data
Apr. 28, 2006 (GB) .................... 0608499.0

(51) Int. Cl.
H01L 51/54 (2006.01)

(52) U.S. Cl. ... 428/690; 428/917; 257/40; 257/E51.032; 528/394; 528/397; 528/422

(58) Field of Classification Search ........... 428/690, 428/917; 313/504, 505, 506; 257/40, E51.032; 528/394, 397, 422
See application file for complete search history.

(56) References Cited

U.S. PATENT DOCUMENTS

| | | | |
|---|---|---|---|
| 4,539,507 A | 9/1985 | VanSlyke et al. | |
| 5,150,006 A | 9/1992 | Van Slyke et al. | |
| 5,432,014 A | 7/1995 | Sano et al. | |
| 5,723,873 A | 3/1998 | Yang | |
| 5,777,070 A * | 7/1998 | Inbasekaran et al. | 528/394 |
| 5,798,170 A | 8/1998 | Zhang et al. | |
| 6,083,634 A | 7/2000 | Shi | |
| 6,268,695 B1 | 7/2001 | Affinito | |
| 6,309,763 B1 | 10/2001 | Woo et al. | |
| 6,353,083 B1 | 3/2002 | Inbasekaran et al. | |
| 6,828,044 B2 * | 12/2004 | Conley | 428/690 |
| 7,030,138 B2 | 4/2006 | Fujimoto et al. | |
| 7,094,477 B2 | 8/2006 | Kamatani et al. | |
| 7,125,998 B2 | 10/2006 | Stossel et al. | |
| 7,147,935 B2 | 12/2006 | Kamatani et al. | |
| 7,238,435 B2 | 7/2007 | Kamatani et al. | |
| 2002/0117662 A1 | 8/2002 | Nii | |
| 2002/0182441 A1 | 12/2002 | Lamansky et al. | |
| 2004/0170839 A1* | 9/2004 | O'Dell et al. | 428/421 |
| 2004/0262574 A1 | 12/2004 | Suzuki et al. | |

FOREIGN PATENT DOCUMENTS

| | | |
|---|---|---|
| EP | 0 880 303 A1 | 11/1998 |
| EP | 0 901 176 A2 | 3/1999 |
| EP | 0 947 123 A1 | 10/1999 |
| EP | 0 949 850 A1 | 10/1999 |
| EP | 1 245 659 A1 | 10/2002 |
| EP | 1 528 074 A1 | 5/2005 |
| GB | 2 348 316 A | 9/2000 |
| JP | 2002-324679 A | 11/2002 |
| JP | 2004-131700 A | 4/2004 |
| WO | WO-90/13148 A1 | 11/1990 |
| WO | WO-98/57381 A1 | 2/1998 |
| WO | WO-98/10621 A1 | 3/1998 |
| WO | WO-99/48160 A1 | 9/1999 |
| WO | WO-00/46321 A1 | 8/2000 |
| WO | WO-00/48258 A1 | 8/2000 |
| WO | WO-00/53656 A1 | 9/2000 |
| WO | WO-00/55927 A1 | 9/2000 |
| WO | WO-01/19142 A1 | 3/2001 |
| WO | WO-01/62869 A1 | 8/2001 |
| WO | WO-01/81649 A1 | 11/2001 |
| WO | WO-02/31896 A2 | 4/2002 |
| WO | WO-02/44189 A1 | 6/2002 |
| WO | WO-02/45466 A1 | 6/2002 |
| WO | WO-02/066552 A1 | 8/2002 |
| WO | WO-02/068435 A1 | 9/2002 |
| WO | WO-02/081448 A1 | 10/2002 |
| WO | WO-02/084759 A1 | 10/2002 |
| WO | WO-03/018653 A1 | 3/2003 |
| WO | WO-03/022908 A1 | 3/2003 |
| WO | WO-03/080559 | 10/2003 |
| WO | WO-03/095586 A1 | 11/2003 |
| WO | WO-2004/020371 | 3/2004 |
| WO | WO-2004/020372 | 3/2004 |
| WO | WO-2004/020387 | 3/2004 |
| WO | WO2004/020387 * | 3/2004 |
| WO | WO-2004/023573 A2 | 3/2004 |
| WO | WO-2004/041902 A2 | 5/2004 |

OTHER PUBLICATIONS

Woo et. al., Light Emitting Diodes based on Fluorene Polymers, 2000, Thin Solid Films, vol. 363, pp. 55-57.*
Thompson etal., High-performance polymer light-emitting diode doped with a red phosphorescent iridium complex,2002, Applied Physics Letters, vol. 80, No. 13, pp. 2308-2310.*
Feng etal., Theoretical Study on Electronic Structure and Optical Properties of Phenothiazine-Containing Conjugated Oligomers and Polymers, 2005, J. Org. Chem., vol. 70, pp. 5987-5996.*
International Search Report for PCT/GB2007/001420 dated Sep. 3, 2007.
Bernius et al., "Light-Emitting Diodes Based on Fluorene Polymers," *Thin Solid Films*, 363:55-57 (2000).
Briere et al., "Electronic, Structural, and Optical Properties of Conjugated Polymers Based on Carbazole, Fluorene, and Borafluorene," *J. Phys. Chem. B*, 108:3123-3129 (2004).
Chen et al., "Recent Developments in Molecular Organic Electroluminescent Materials," *Macromol. Symp.*, 125:1-48 (1997).
Chen et al., "Triplet Exciton Confinement in Phosphorescent Polymer Light-Emitting Diodes," *Appl. Phys. Lett.*, 82(7):1006-1008 (2003).

(Continued)

*Primary Examiner* — Jennifer A Chriss
*Assistant Examiner* — Gregory Clark
(74) *Attorney, Agent, or Firm* — Marshall, Gerstein & Borun LLP

(57) ABSTRACT

A polymer for use in an opto-electrical device comprising aromatically conjugated repeat units of optionally substituted 9,9-dimethylfluorene.

19 Claims, 2 Drawing Sheets

OTHER PUBLICATIONS

Cleave et al., "Harvesting Singlet and Triplet Energy in Polymer LEDs," *Adv. Mater.*, 11(4):285-288 (1999).

Ikai et al., "Highly Efficient Phosphorescence from Organic Light-Emitting Devices with an Exciton-Block Layer," *Appl. Phys. Lett.*, 79(2):156-158 (2001).

Kobayashi et al., "A Novel RGB Multicolor Light-Emitting Polymer Display," *Syth. Met.*, 111-112:125-128 (2000).

Lane et al., "Origin of Electrophosphorescence from a Doped Polymer Light Emitting Diode," *Phys. Rev. B.*, 63:235206-1-235201-8 (2001).

Lee et al., "Polymer Phosphorescent Light-Emitting Devices Doped with Tris(2-phenylpyridine) Iridium as a Triplet Emitter," *Appl. Phys. Lett.*, 77(15):2280-2282 (2000).

Niu et al., "Thermal Annealing Below the Glass Transition Temperature: A General Way to Increase Performance of Light-Emitting Diodes Based on Copolyfluorenes," *Appl. Phys. Lett.*, 81(4):634-636 (2002).

O'Brien et al., "Electrophosphorescence from a Doped Polymer Light Emitting Diode," *Synth. Met.*, 116:379-383 (2001).

Rault-Berthelot et al., "The Anodic Oxidation of Fluorene and Some of its Derivatives; Conditions for the Formation of a New Conducting Polymer," *J. Electronal. Chem.*, 182:187-192 (1985).

Rault-Berthelot et al., "The Polyfluorenes: A Family of Versatile Electroactive Polymers. (1). Electropolymerization of Fluorenes," *New Journal of Chemistry*, 10(3):169-177 (1986).

Yamaguchi et al., "Effects of B and C on the Ordering of $L1_0$-CoPt Thin Films," *Appl. Phys. Lett.*, 79(13):2001-2003 (2001).

Yamamoto et al., "Electrically Conducting and Thermally Stable π-Conjugated Poly(arylene)s Prepared by Organometallic Processes," *Prog. Polym. Sci.*, 17:1153-1205 (1992).

Zhu et al., "Synthesis of New Iridium Complexes and Their Electrophosphorescent Properties in Polymer Light-Emitting Diodes," *J. Mater. Chem.*, 13:50-55 (2003).

Combined Search and Examination Report for Application No. GB0608499.0, dated Aug. 29, 2006.

European Examination Report for Application No. 07732462.2-2102, dated Jul. 8, 2010.

International Preliminary Report on Patentability for Application No. PCT/GB2007/001420, dated Oct. 28, 2008.

Written Opinion for Application No. PCT/GB2007/001420, dated Sep. 3, 2007.

* cited by examiner

OPTO-ELECTRICAL POLYMERS AND DEVICES

FIELD OF THE INVENTION

The present invention relates to opto-electrical devices, in particular polymer light-emitting devices, and opto-electrical polymers for use therein.

BACKGROUND OF THE INVENTION

One class of opto-electrical devices is those using an organic material for light emission or detection. The basic structure of these devices is a light emissive organic layer, for instance a film of a poly(p-phenylenevinylene) ("PPV") or polyfluorene, sandwiched between a cathode for injecting negative charge carriers (electrons) and an anode for injecting positive charge carriers (holes) into the organic layer. The electrons and holes combine in the organic layer generating photons. In WO 90/13148 the organic light-emissive material is a polymer. In U.S. Pat. No. 4,539,507 the organic light-emissive material is of the class known as small molecule materials, such as (8-hydroxyquinoline) aluminium ("Alq3"). In a practical device one of the electrodes is transparent, to allow the photons to escape the device.

A typical organic light-emissive device ("OLED") is fabricated on a glass or plastic substrate coated with a transparent first electrode such as indium-tin-oxide ("ITO"). A layer of a thin film of at least one electroluminescent organic material covers the first electrode. Finally, a cathode covers the layer of electroluminescent organic material. The cathode is typically a metal or alloy and may comprise a single layer, such as aluminium, or a plurality of layers such as calcium and aluminium. Other layers can be added to the device, for example to improve charge injection from the electrodes to the electroluminescent material. For example, a hole injection layer such as poly (ethylene dioxythiophene)/polystyrene sulfonate (PEDOT-PSS) or polyaniline may be provided between the anode and the electroluminescent material. When a voltage is applied between the electrodes from a power supply one of the electrodes acts as a cathode and the other as an anode. For organic semiconductors important characteristics are the binding energies, measured with respect to the vacuum level of the electronic energy levels, particularly the "highest occupied molecular orbital" (HOMO) and the "lowest unoccupied molecular orbital" (LUMO) level. These can be estimated from measurements of photoemission and particularly measurements of the electrochemical potentials for oxidation and reduction. It is well understood in this field that such energies are affected by a number of factors, such as the local environment near an interface, and the point on the curve (peak) from which the value is determined. Accordingly, the use of such values is indicative rather than quantitative.

In operation, holes are injected into the device through the anode and electrons are injected into the device through the cathode. The holes and electrons combine in the organic electroluminescent layer to form an exciton which then undergoes radiative decay to give light. One way of improving efficiency of devices is to provide hole and electron transporting materials—for example, WO 99/48610 discloses blending of hole transporting polymers, electron transporting polymers and electroluminescent polymers. A 1:1 copolymer of dioctylfluorene and triphenylamine is used as the hole transporting polymer in this document.

A focus in the field of polymer OLEDs is the development of full colour displays for which red, green and blue emissive materials are required. One drawback with existing polymer OLED displays relevant to this development is the relatively short lifetime of blue emissive materials known to date (by "lifetime" is meant the time for the brightness of the OLED to halve at constant current when operated under DC drive).

In one approach, the lifetime of the emissive material may be extended by optimisation of the OLED architecture; for example lifetime of the blue material may in part be dependant on the cathode being used. However, the advantage of selecting a cathode that improves blue lifetime may be offset by disadvantageous effects of the cathode on performance of red and green materials. For example, Synthetic Metals 111-112 (2000), 125-128 discloses a full colour display wherein the cathode is LiF/Ca/Al. The present inventors have found that this cathode is particularly efficacious with respect to the blue emissive material but shows poor performance with respect to green and, especially, red emitters.

Another approach is development of novel blue electroluminescent materials. For example, WO 00/55927, which is a development of WO 99/48160, discloses a blue electroluminescent polymer of formula (w):

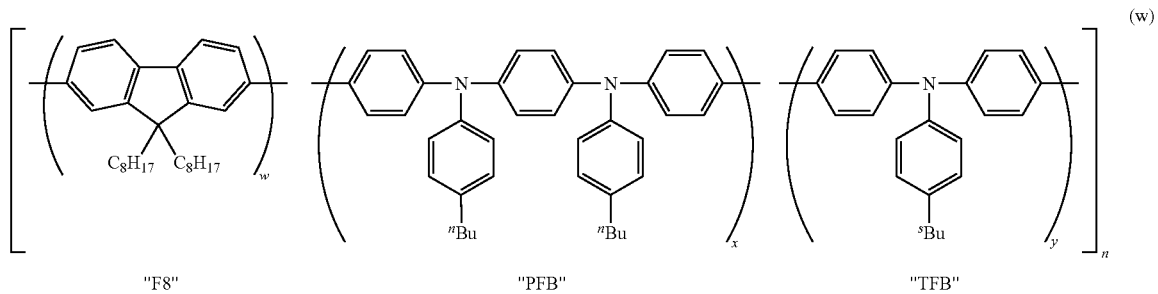

wherein $w+x+y=1$, $w \geq 0.5$, $0 \leq x+y \leq 0.5$, and $n \geq 2$

In essence, the repeat units of the separate polymers disclosed in WO 99/48160 are combined into a single molecule. The F8 repeat unit is provided for the purpose of electron injection; the TFB unit is provided for the purpose of hole transport; and the PFB repeat unit is provided as the emissive unit.

In another example, disclosed in WO 03/095586, it was found that the lifetime of a polymer for use in an optical device, in particular an electroluminescent polymer, may be increased by the incorporation of repeat units that increase the glass temperature (Tg) of the polymer. In particular, incorporation of 2,7-linked 9,9-diarylfluorene repeat units into an electroluminescent polymer, particularly a blue emissive electroluminescent polymer, results in significant increase in that polymer's lifetime. Furthermore, it was found to be unnecessary to have separate hole transporting units and blue emissive units; it was found that both functions may be performed by the PFB unit. Surprisingly, the omission of TFB from the prior art polymers described above was found to result in a significant improvement in lifetime. A preferred embodiment disclosed in WO 03/095586 is a blue electroluminescent polymer prepared in accordance with the process of WO 00/53656 by reaction of 9,9-di-n-octylfluorene-2,7-di (ethylenylboronate) (0.5 equivalents), 2,7-dibromo-9,9-diphenylfluorene (0.35 equivalents) and N,N'-di(4-bromophenyl)-N,N'-di(4-n-butylphenyl)-1,4-diaminobenzene (0.15 equivalents) to give polymer (P1):

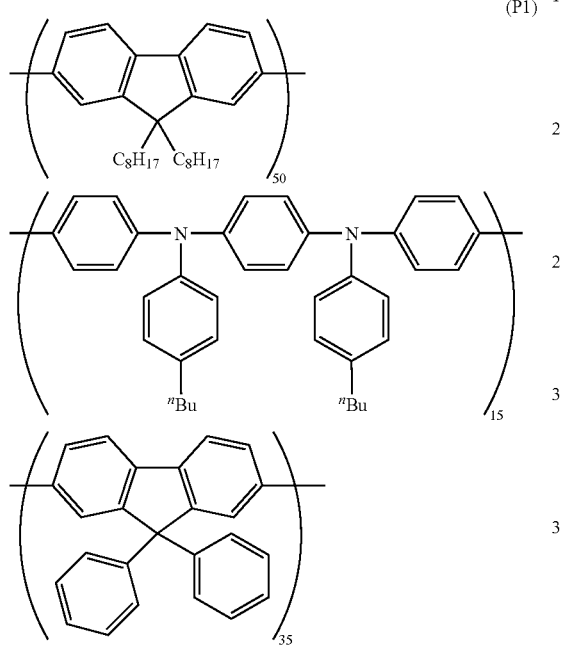

(P1)

In another example, disclosed in WO 04/041902, it was determined that improved electron injection, and therefore improved device performance, may be accomplished by increasing the electron affinity of known polyfluorenes (by providing a deeper LUMO). This was achieved in WO 04/041902 by providing fluorene repeat units having electron withdrawing aryl groups. It was also found that increasing electron affinity in this manner lead to better lifetimes for the polymers disclosed therein.

U.S. Pat. No. 6,309,763, discloses a copolymer comprising 10-90% by weight of the group of formula (y):

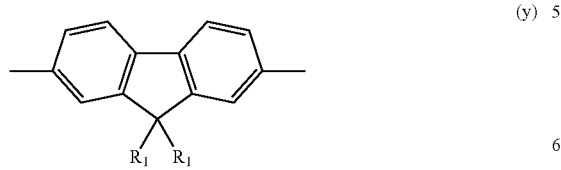

(y)

wherein $R_1$ is independently selected in each occurrence from, among other things, $C_1$-$C_{20}$ hydrocarbyl. The repeat unit is provided in a copolymer with 10-90% triarylamine. In all the examples each $R_1$ is $C_8H_{17}$ as in polymers (w) and (P1) discussed above.

EP 1528074 also discloses various polymers comprising the above-identified fluorene group in which $R_1$ is $C_8H_{17}$. In example 2 of EP 1528074, there is also disclosed a polymer comprising a 9,9-dimethylfluorene unit directly bonded to nitrogen atoms in the backbone as shown in formula ($y_2$):

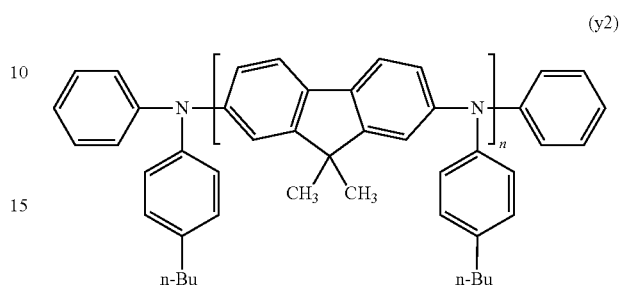

(y2)

JP 2004-131700 also discloses various polymers comprising a fluorene group in which $R_1$ is $C_8H_{17}$. In addition, this document also discloses a polymer comprising 9,9-dimethylfluorene directly bonded to silicon in the polymer backbone as shown in formula ($y_3$):

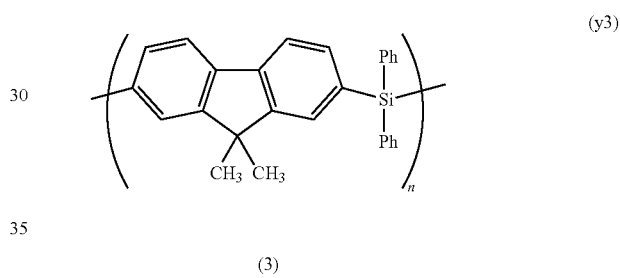

(y3)

(3)

It is an aim of the present invention to provide a means for increasing the lifetime of polymers for use in an optical device above that of prior art polymers such as those discussed above. It is a further aim of the invention to provide a long-lived polymer for use in an opto-electrical device, particularly a long-lived blue electroluminescent material. It is a yet further aim of the invention to provide a means for increasing the thermal stability of the prior art polymers such as those discussed above. It is yet a further aim of the invention to provide improved device performance.

SUMMARY OF THE INVENTION

In accordance with a first aspect of the present invention there is provided a polymer for use in an opto-electrical device comprising aromatically conjugated repeat units of optionally substituted 9,9-dimethylfluorene. Preferably, the 9,9-dimethylfluorene repeat units are 2,7-linked into the polymer as shown in Formula (a):

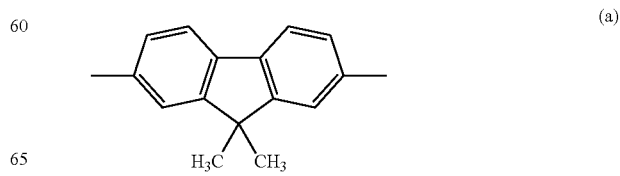

(a)

By "aromatically conjugated" we mean that the six membered aromatic rings in the 9,9-dimethylfluorene repeat unit are linked to aromatic rings in adjacent repeat units by a single bond. Preferably, this linkage is along the backbone of the polymer.

The present inventors have surprisingly found that the lifetime of a polymer for use in an opto-electrical device, in particular an electroluminescent polymer, is increased by the incorporation of aromatically conjugated repeat units of 9,9-dimethylfluorene.

The aromatically conjugated 9,9-dimethylfluorene surprisingly increases the electron affinity of a polymer when compared to an equivalent polymer comprising 9,9-dioctylfluorene such as prior art polymer P1. The aromatically conjugated 9,9-dimethylfluorene improves electron injection, and therefore improves device performance.

Furthermore, the glass transition temperature (Tg) of the polymer is increased when compared to an equivalent polymer comprising 9,9-dioctylfluorene such as the prior art polymer P1, providing a means for increasing the thermal stability of opto-electrical semi-conductive polymers.

Preferably, the aromatically conjugated 9,9-dimethylfluorene is provided in a co-polymer comprising one or more other aromatically conjugated repeat units. The other aromatically conjugated repeat units can provide other functionalities such as hole transport and emission.

Preferable co-repeat units include amines and/or optionally substituted fluorene units other than 9,9-dimethylfluorene, for example, fluorene units with a $C_{2-20}$ alkyl or alkoxy and/or fluorene units with an aryl or heteroaryl.

Preferably, one or more other aromatically conjugated repeat unit includes an amine repeat unit.

Preferably, the one or more other aromatically conjugated repeat units comprise an optionally substituted repeat unit of formula (b):

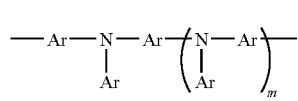

(b)

wherein each Ar is the same or different and comprises an optionally substituted aryl or heteroaryl group; m is 0, 1 or 2; and two or more aryl groups may be linked by a direct bond or a divalent group.

Preferably, m is 0. Preferably, aryl groups in the polymer backbone are linked by a divalent group. Preferred examples of divalent groups include O, S.

Very preferably, the optionally substituted repeat unit of formula (b) has the structure:

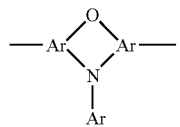

The repeat unit (b) is provided as an emissive unit in the copolymer and can also provide hole transport functionality. A small amount of optionally substituted —Ar—N(Ar)—Ar— may also be present in the copolymer. Preferably, this repeat unit is in a molar ratio of no greater than 5%. However, since the repeat unit of formula (b) fulfils both emission and hole transport functions, no other nitrogen containing hole transport repeat units are required. Accordingly, in a preferred embodiment the polymer comprises no repeat units comprising nitrogen atoms in the repeat unit backbone other than the repeat unit of formula (b).

Each Ar is preferably an optionally substituted phenyl.

Another example is a repeat unit of formula (c):

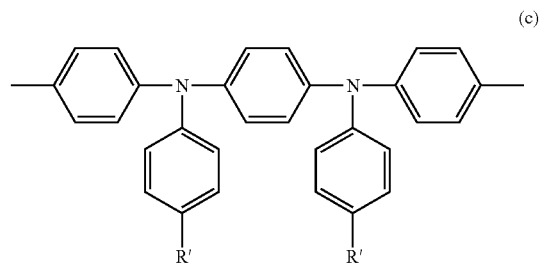

(c)

wherein each R' is independently selected from hydrogen or a solubilising group.

Another example is an, optionally substituted, repeat unit of formula (d) that is optionally substituted with one or more substituents:

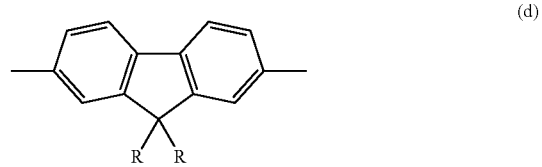

(d)

wherein each R is the same or different, and the two R groups together may form a ring and/or at least one R group may form a ring with the at least one optional substituent, for example as shown in the structure below:

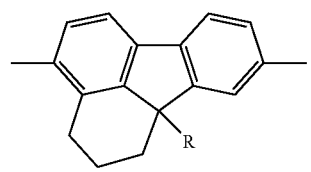

Preferred groups R are independently selected from the group consisting of alkyl, alkoxy, aryl and heteroaryl, each of which may optionally be further substituted.

Very preferably, the optionally substituted, repeat unit of formula (d) has the structure:

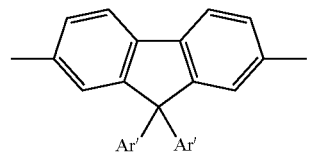

wherein each Ar' is the same or different and comprises an optionally substituted aryl or heteroaryl group. Preferably, each Ar' is optionally substituted phenyl. Optionally, one or both of the Ar' comprise electron withdrawing groups. Optionally, one or both of the Ar' comprise solubilising groups.

The provision of solubilising groups can be particularly useful in embodiments of the present invention. This is because the 9,9-dimethylfluorene is less soluble in organic solvents than 9,9-dioctylfluorene, for example. Accordingly, it is advantageous in some applications to improve the solution processability of a polymer comprising this repeat unit by providing co-repeat units which are more soluble than 9,9-dimethylfluorene. This may be achieved by, for example, providing aryl co-repeat units having solubilising side groups thereon. Examples of suitable solubilising side groups include optionally substituted $C_4$-$C_{20}$ alkyl or alkoxy groups, more preferably $C_4$-$C_{10}$ alkyl groups, and most preferably $C_6$-$C_8$ alkyl groups. The solubilising substituents may be provided, for example, in the 9-position of a fluorene repeat unit or bound to the pendant aryl groups in the case of, for example, 9,9-diphenylfluorene or PFB.

Preferably, the polymer is an electroluminescent polymer, more preferably a polymer capable of emitting light in the wavelength range 400-500 nm, most preferably 430-500 nm. It has been found that polymers comprising 9,9-dimethylfluorene are particularly useful as blue emitters which have a longer lifetime than the prior art blue emitters disclosed in the background section.

In accordance with a second aspect of the present invention there is provided an opto-electrical device comprising a first electrode, a second electrode, and a semi-conductive region located between the first and second electrodes, the semi-conductive region comprising a polymer according to the first aspect of the invention.

The polymer according to the first aspect of the invention may be provided in a blended layer with other polymers, dendrimers or small molecules. Alternatively, it may be provided in a layer on its own, the polymer comprising all moieties necessary to perform the function of the layer.

Preferably, the polymer is provided in an electroluminescent layer of the semiconductive region.

In one embodiment the electroluminescent layer comprises one or more phosphorescent moieties, the polymer according to the first aspect of the invention acting as a host for the one or more phosphorescent moieties. It has been found that polymers comprising 9,9-dimethylfluorene are particularly useful as host materials which do not quench emission from phosphorescent moieties.

The polymer may be provided in a charge transporting layer of the semi-conductive region, e.g. an electron transporting layer disposed between the electroluminescent layer and the cathode or a hole transporting layer disposed between the electroluminescent layer and the anode. For the avoidance of doubt, it will be appreciated that, where present, a hole injection material (such as PEDOT-PSS or polyaniline), a hole transporting layer or an electron transporting layer separate from the electroluminescent layer do not constitute a part of the electroluminescent layer.

BRIEF DESCRIPTION OF THE DRAWINGS

The present invention will now be described in further detail, by way of example only, with reference to the accompanying drawings in which.

DETAILED DESCRIPTION OF THE INVENTION

General Device Architecture

Figure 1:
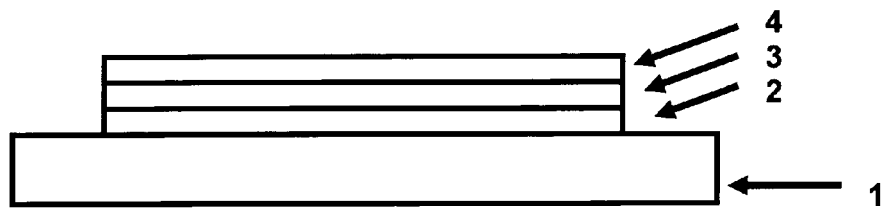
FIG. 1 shows an electroluminescent device.

With reference to FIG. 1, the standard architecture of an electroluminescent device according to the invention comprises a transparent glass or plastic substrate 1, an anode of indium tin oxide 2 and a cathode 4. The polymer according to the invention is located in layer 3 between anode 2 and cathode 4. Layer 3 may comprise the polymer according to the invention alone or a plurality of polymers.

Electroluminescent devices may be monochrome devices or full colour devices (i.e. formed from red, green and blue electroluminescent materials). By "red electroluminescent material" is meant an organic material that by electroluminescence emits radiation having a wavelength in the range of 600-750 nm, preferably 600-700 nm, more preferably 610-650 nm and most preferably having an emission peak around 650-660 nm. By "green electroluminescent material" is meant an organic material that by electroluminescence emits radiation having a wavelength in the range of 510-580 nm, preferably 510-570 nm. By "blue electroluminescent material" is meant an organic material that by electroluminescence emits radiation having a wavelength in the range of 400-500 nm, more preferably 430-500 nm.

Charge Transporting Layers

Further layers may be located between anode 2 and cathode 4, such as charge transporting, charge injecting or charge blocking layers.

In particular, it is desirable to provide a conductive hole injection layer formed of a doped organic material located between the anode 2 and the electroluminescent layer 3 to assist hole injection from the anode into the layer or layers of semiconducting polymer. Examples of doped organic hole injection materials include poly(ethylene dioxythiophene) (PEDT), in particular PEDT doped with polystyrene sulfonate (PSS) as disclosed in EP 0901176 and EP 0947123, or polyaniline as disclosed in U.S. Pat. No. 5,723,873 and U.S. Pat. No. 5,798,170.

If present, a hole transporting layer located between anode 2 and electroluminescent layer 3 preferably has a HOMO level of less than or equal to 5.5 eV, more preferably around 4.8-5.5 eV.

If present, an electron transporting layer located between electroluminescent layer 3 and cathode 4 preferably has a LUMO level of around 3-3.5 eV.

Electrodes

Cathode 4 is selected from materials that have a workfunction allowing injection of electrons into the electroluminescent layer. Other factors influence the selection of the cathode such as the possibility of adverse interactions between the cathode and the electroluminescent material. The cathode may consist of a single material such as a layer of aluminium. Alternatively, it may comprise a plurality of metals, for example a bilayer of calcium and aluminium as disclosed in WO 98/10621, elemental barium disclosed in WO 98/57381, Appl. Phys. Lett. 2002, 81(4), 634 and WO 02/84759 or a thin layer of dielectric material to assist electron injection, for example lithium fluoride disclosed in WO 00/48258 or barium fluoride, disclosed in Appl. Phys. Lett. 2001, 79(5), 2001. In order to provide efficient injection of electrons into the device, the cathode preferably has a workfunction of less than 3.5 eV, more preferably less than 3.2 eV, most preferably less than 3 eV.

In a practical device, at least one of the electrodes is semi-transparent in order that light may be absorbed (in the case of a photoresponsive device) or emitted (in the case of an OLED). Where the anode is transparent, it typically comprises indium tin oxide. Examples of transparent cathodes are disclosed in, for example, GB 2348316.

The embodiment of FIG. 1 illustrates a device wherein the device is formed by firstly forming an anode on a substrate followed by deposition of an electroluminescent layer and a cathode, however it will be appreciated that the device of the invention could also be formed by firstly forming a cathode on a substrate followed by deposition of an electroluminescent layer and an anode.

Encapsulation

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

The device is preferably encapsulated with an encapsulant (not shown) to preventingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142. A getter material for absorption of any atmospheric moisture and/or oxygen that may permeate through the substrate or encapsulant may be disposed between the substrate and the encapsulant.

Electroluminescent Layer

Electroluminescent layer 3 may consist of the electroluminescent material alone or may comprise the electroluminescent material in combination with one or more further materials. In particular, the electroluminescent material may be blended with hole and/or electron transporting materials as disclosed in, for example, WO 99/48160. Alternatively, the electroluminescent material may be covalently bound to a charge transporting material Polymers According to Embodiments of the Present Invention Polymers according to embodiments of the present invention may comprise an arylene co-repeat unit Ar such as a fluorene, particularly 2,7-linked 9,9-dialkylfluorene or 2,7-linked 9,9-diarylfluorene; a spirofluorene such as 2,7-linked 9,9-spirofluorene; an indenofluorene such as a 2,7-linked indenofluorene; or a phenyl such as alkyl or alkoxy substituted 1,4-phenylene. Each of these groups may be substituted.

Further suitable Ar groups are known in this art, for example as disclosed in WO00/55927, WO 00/46321, WO03/095586 and WO 2004/041902.

A polymer according to the present invention may comprise a homopolymer, copolymer, terpolymer or higher order polymer.

A copolymer, terpolymer or higher order polymer according to the present invention includes regular alternating, random and block polymers where the percentage of each monomer used to prepare the polymer may vary.

For ease of processing, it is preferred that the polymer is soluble. Substituents such as $C_{1-10}$ alkyl or $C_{1-10}$ alkoxy may usefully be selected to confer on the polymer solubility in a particular solvent system. Typical solvents include mono- or poly-alkylated benzenes such as toluene and xylene or THF.

A polymer comprising the aromatically conjugated 9,9-dimethylfluorene may provide one or more of the functions of hole transport, electron transport and emission depending on which layer of the device it is used in and the nature of co-repeat units.

A homopolymer of the aromatically conjugated 9,9-dimethylfluorene may be utilised to provide electron transport.

A copolymer comprising the aromatically conjugated 9,9-dimethylfluorene and a triarylamine repeat unit, in particular a repeat unit selected from formulae 1-6, may be utilised to provide hole transport and/or emission:

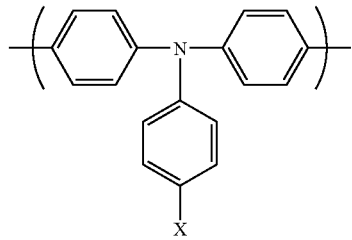

1

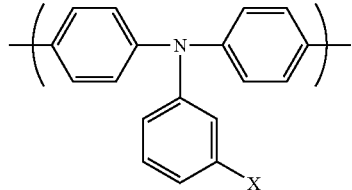

2

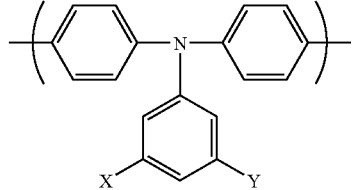

3

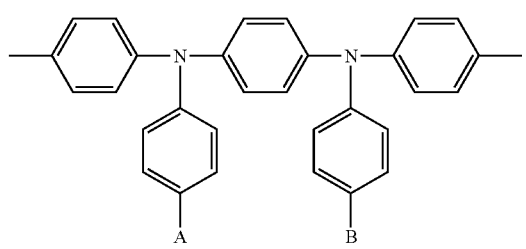

4

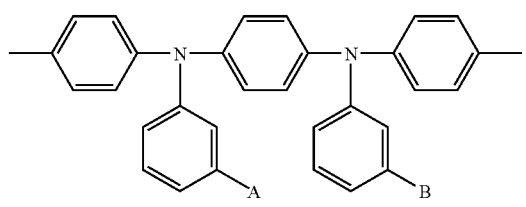

5

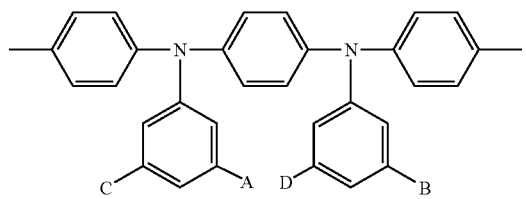

6 wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are C1-10 alkyl. Optionally, any two of the aromatic rings may be linked by a direct bond or a divalent group such as an oxygen or sulphur atom.

Particularly preferred hole transporting polymers of this type are AB copolymers of the aromatically conjugated 9,9-dimethylfluorene and a triarylamine repeat unit.

A copolymer comprising an aromatically conjugated 9,9-dimethylfluorene and a heteroarylene repeat unit may be utilised for charge transport or emission. Preferred heteroarylene repeat units are selected from formulae 7-21:

7

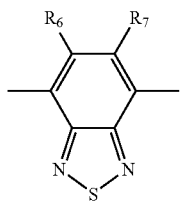

wherein $R_6$ and $R_7$ are the same or different and are each independently hydrogen or a substituent group, preferably alkyl, aryl, perfluoroalkyl, thioalkyl, cyano, alkoxy, heteroaryl, alkylaryl or arylalkyl. For ease of manufacture, $R_6$ and $R_7$ are preferably the same. More preferably, they are the same and are each a phenyl group.

8

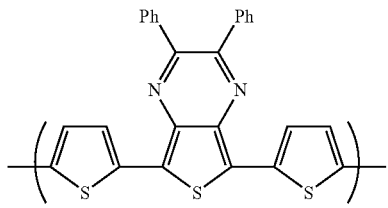

9

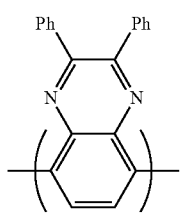

10

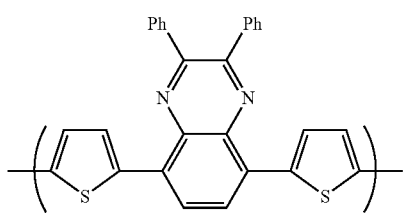

11

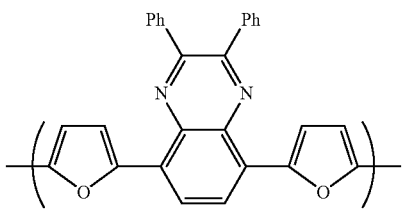

12

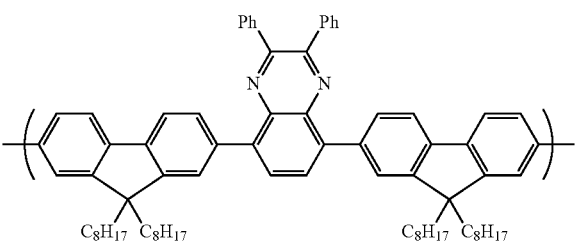

13

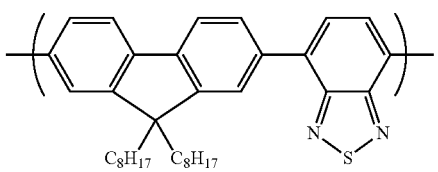

14

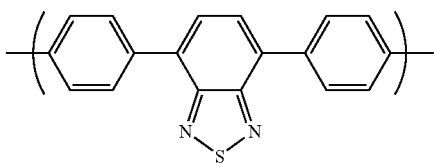

15

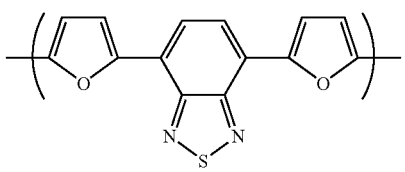

16

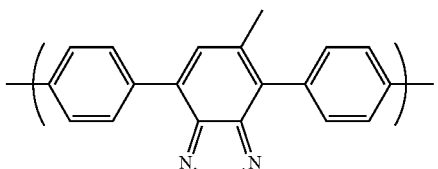

17

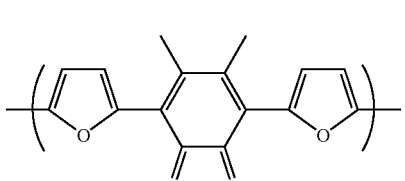

18

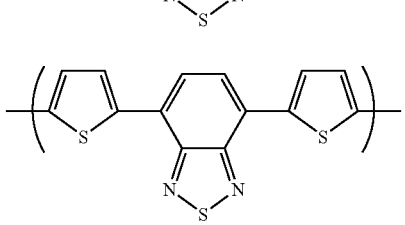

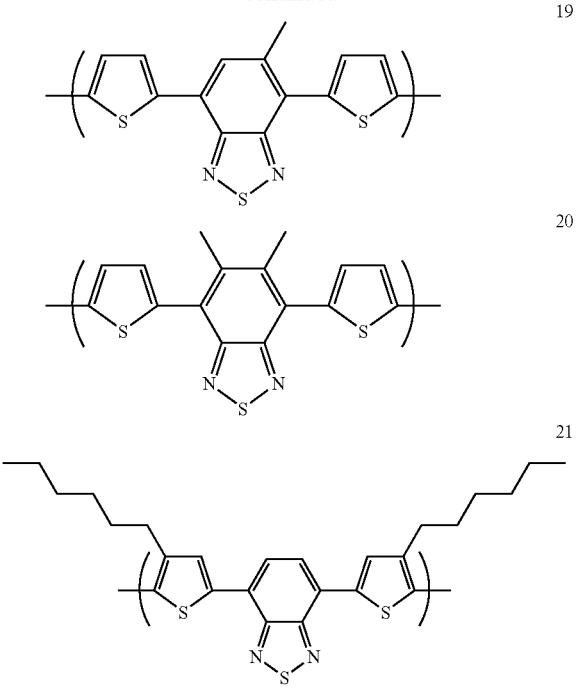

Electroluminescent copolymers may comprise an electroluminescent region and at least one of a hole transporting region and an electron transporting region as disclosed in, for example, WO 00/55927 and U.S. Pat. No. 6,353,083. If only one of a hole transporting region and electron transporting region is provided then the electroluminescent region may also provide the other of hole transport and electron transport functionality.

The different regions within such a polymer may be provided along the polymer backbone, as per U.S. Pat. No. 6,353,083, or as groups pendant from the polymer backbone as per WO 01/62869.

Polymerisation Methods

Preferred methods for preparation of these polymers are Suzuki polymerisation as described in, for example, WO 00/53656 and Yamamoto polymerisation as described in, for example, T. Yamamoto, "Electrically Conducting And Thermally Stable □-Conjugated Poly(arylene)s Prepared by Organometallic Processes", Progress in Polymer Science 1993, 17, 1153-1205. These polymerisation techniques both operate via a "metal insertion" wherein the metal atom of a metal complex catalyst is inserted between an aryl group and a leaving group of a monomer. In the case of Yamamoto polymerisation, a nickel complex catalyst is used; in the case of Suzuki polymerisation, a palladium complex catalyst is used.

For example, in the synthesis of a linear polymer by Yamamoto polymerisation, a monomer having two reactive halogen groups is used. Similarly, according to the method of Suzuki polymerisation, at least one reactive group is a boron derivative group such as a boronic acid or boronic ester and the other reactive group is a halogen. Preferred halogens are chlorine, bromine and iodine, most preferably bromine.

It will therefore be appreciated that repeat units and end groups comprising aryl groups as illustrated throughout this application may be derived from a monomer carrying a suitable leaving group.

Suzuki polymerisation may be used to prepare regioregular, block and random copolymers. In particular, homopolymers or random copolymers may be prepared when one reactive group is a halogen and the other reactive group is a boron derivative group. Alternatively, block or regioregular, in particular AB, copolymers may be prepared when both reactive groups of a first monomer are boron and both reactive groups of a second monomer are halogen.

As alternatives to halides, other leaving groups capable of participating in metal insertion include groups include tosylate, mesylate and triflate.

Solution Processing

A single polymer or a plurality of polymers may be deposited from solution to form layer 5. Suitable solvents for polyarylenes, in particular polyfluorenes, include mono- or poly-alkylbenzenes such as toluene and xylene. Particularly preferred solution deposition techniques are spin-coating and inkjet printing.

Spin-coating is particularly suitable for devices wherein patterning of the electroluminescent material is unnecessary—for example for lighting applications or simple monochrome segmented displays.

Inkjet printing is particularly suitable for high information content displays, in particular full colour displays. Inkjet printing of OLEDs is described in, for example, EP 0880303.

If multiple layers of the device are formed by solution processing then the skilled person will be aware of techniques to prevent intermixing of adjacent layers, for example by crosslinking of one layer before deposition of a subsequent layer or selection of materials for adjacent layers such that the material from which the first of these layers is formed is not soluble in the solvent used to deposit the second layer.

Where a plurality of polymers are deposited, they may comprise a blend of at least two of a hole transporting polymer, an electron transporting polymer and, where the device is a PLED, an emissive polymer as disclosed in WO 99/48160. Alternatively, layer 3 may be formed from a single polymer that comprises regions selected from two or more of hole transporting regions, electron transporting regions and emissive regions as disclosed in, for example, WO 00/55927 and U.S. Pat. No. 6,353,083. Each of the functions of hole transport, electron transport and emission may be provided by separate polymers or separate regions of a single polymer. Alternatively, more than one function may be performed by a single region or polymer. In particular, a single polymer or region may be capable of both charge transport and emission. Each region may comprise a single repeat unit, e.g. a triarylamine repeat unit may be a hole transporting region.

Alternatively, each region may be a chain of repeat units, such as a chain of polyfluorene units as an electron transporting region. The different regions within such a polymer may be provided along the polymer backbone, as per U.S. Pat. No. 6,353,083, or as groups pendant from the polymer backbone as per WO 01/62869.

Hosts for Phosphorescent Emitters

Numerous hosts are described in the prior art including "small molecule" hosts such as 4,4'-bis(carbazol-9-yl)biphenyl), known as CBP, and (4,4',4"-tris(carbazol-9-yl)triphenylamine), known as TCTA, disclosed in Ikai et al. (Appl. Phys. Lett., 79 no. 2, 2001, 156); and triarylamines such as tris-4-(N-3-methylphenyl-N-phenyl)phenylamine, known as MTDATA. Polymers are also known as hosts, in particular homopolymers such as poly(vinyl carbazole) disclosed in, for example, Appl. Phys. Lett. 2000, 77(15), 2280; polyfluorenes in Synth. Met. 2001, 116, 379, Phys. Rev. B 2001, 63, 235206 and Appl. Phys. Lett. 2003, 82(7), 1006; poly[4-(N-4-vinyl-benzyloxyethyl, N-methylamino)-N-(2,5-di-tert-butylphenylnapthalimide] in Adv. Mater. 1999, 11(4), 285; and poly (para-phenylenes) in J. Mater. Chem. 2003, 13, 50-55. Copolymers are also known as hosts.

It is envisaged that polymers according to the present invention will be useful as hosts for phosphorescent emitters due to the large band gap of polymers comprising aromatically conjugated 9,9-dimethylfluoride.

Metal Complexes

Preferred metal complexes comprise optionally substituted complexes of formula (V):

$$ML^1{}_qL^2{}_rL^3{}_s \qquad (V)$$

wherein M is a metal; each of $L^1$, $L^2$ and $L^3$ is a coordinating group; q is an integer; r and s are each independently 0 or an integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$.

Heavy elements M induce strong spin-orbit coupling to allow rapid intersystem crossing and emission from triplet states (phosphorescence). Suitable heavy metals M include:

lanthanide metals such as cerium, samarium, europium, terbium, dysprosium, thulium, erbium and neodymium; and d-block metals, in particular those in rows 2 and 3 i.e. elements 39 to 48 and 72 to 80, in particular ruthenium, rhodium, pallaidum, rhenium, osmium, iridium, platinum and gold.

Suitable coordinating groups for the f-block metals include oxygen or nitrogen donor systems such as carboxylic acids, 1,3-diketonates, hydroxy carboxylic acids, Schiff bases including acyl phenols and iminoacyl groups. As is known, luminescent lanthanide metal complexes require sensitizing group(s) which have the triplet excited energy level higher than the first excited state of the metal ion. Emission is from an f-f transition of the metal and so the emission colour is determined by the choice of the metal. The sharp emission is generally narrow, resulting in a pure colour emission useful for display applications.

The d-block metals form organometallic complexes with carbon or nitrogen donors such as porphyrin or bidentate ligands of formula (VI):

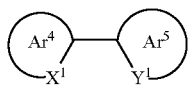

(VI)

wherein $Ar^4$ and $Ar^5$ may be the same or different and are independently selected from optionally substituted aryl or heteroaryl; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

Examples of bidentate ligands are illustrated below:

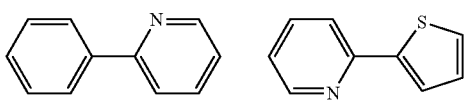

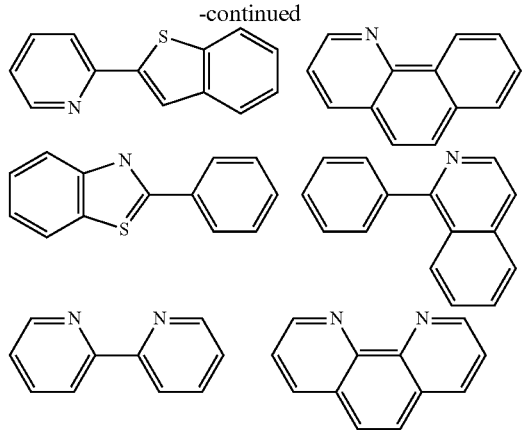

Each of $Ar^4$ and $Ar^5$ may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

Other ligands suitable for use with d-block elements include diketonates, in particular acetylacetonate (acac); triarylphosphines and pyridine, each of which may be substituted.

Main group metal complexes show ligand based, or charge transfer emission. For these complexes, the emission colour is determined by the choice of ligand as well as the metal.

The host material and metal complex may be combined in the form of a physical blend. Alternatively, the metal complex may be chemically bound to the host material. In the case of a polymeric host, the metal complex may be chemically bound as a substituent attached to the polymer backbone, incorporated as a repeat unit in the polymer backbone or provided as an end-group of the polymer as disclosed in, for example, EP 1245659, WO 02/31896, WO 03/18653 and WO 03/22908.

A wide range of fluorescent low molecular weight metal complexes are known and have been demonstrated in organic light emitting devices [see, e.g., Macromol. Sym. 125 (1997) 1-48, U.S. Pat. No. 5,150,006, U.S. Pat. No. 6,083,634 and U.S. Pat. No. 5,432,014], in particular tris-(8-hydroxyquinoline)aluminium. Suitable ligands for di or trivalent metals include: oxinoids, e.g. with oxygen-nitrogen or oxygen-oxygen donating atoms, generally a ring nitrogen atom with a substituent oxygen atom, or a substituent nitrogen atom or oxygen atom with a substituent oxygen atom such as 8-hydroxyquinolate and hydroxyquinoxalinol-10-hydroxybenzo (h) quinolinato (II), benzazoles (III), schiff bases, azoindoles, chromone derivatives, 3-hydroxyflavone, and carboxylic acids such as salicylato amino carboxylates and ester carboxylates. Optional substituents include halogen, alkyl, alkoxy, haloalkyl, cyano, amino, amido, sulfonyl, carbonyl, aryl or heteroaryl on the (hetero) aromatic rings which may modify the emission colour.

It is envisaged that polymers according to the present invention will be useful as hosts for fluorescent emitters, again due to the large band gap of polymers comprising aromatically conjugated 9,9-dimethylfluoride.

Polymer Examples

Figure 2:
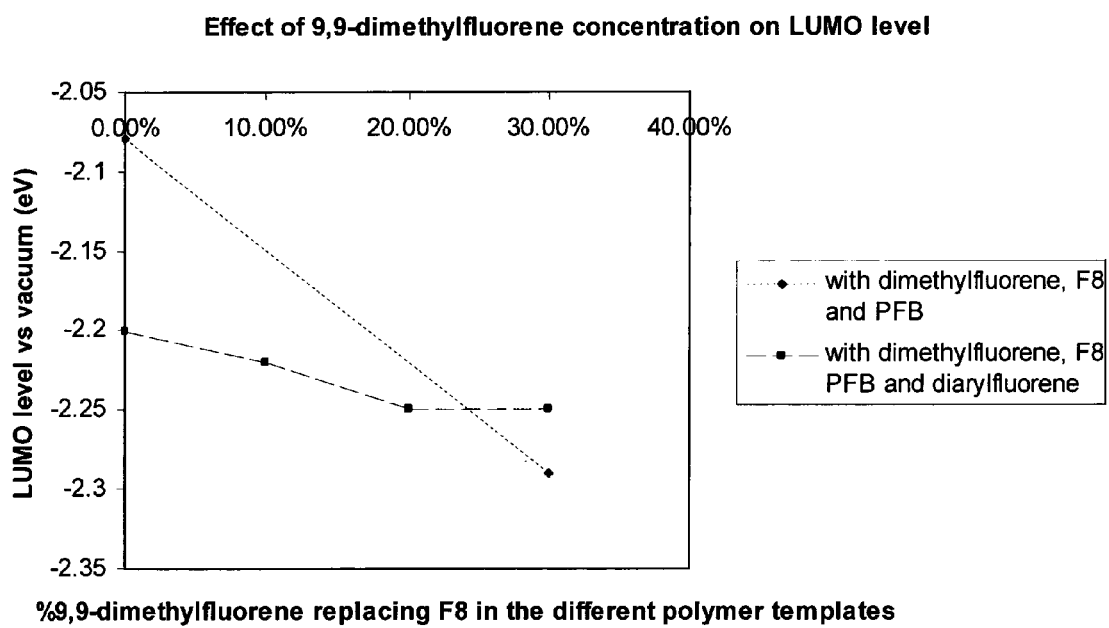
FIG. 2 shows a graph illustrating how the glass transition temperature of two different polymers changes with 9,9-dimethylfluorene content.

Two electroluminescent polymers were prepared using standard Suzuki polymerisation to make polymers from PFB, optionally substituted 9,9-dimethlyfluorene, F8 and optionally substituted 9,9-diphenylfluorene, As can be seen in FIG. 2, by increasing the proportion of 9,9-dimethylfluorene repeat unit in the opto-electrical semi-conductive polymers the glass transition temperature is increased thus increasing the thermal stability of the opto-electrical semi-conductive polymers.

Figure 3:
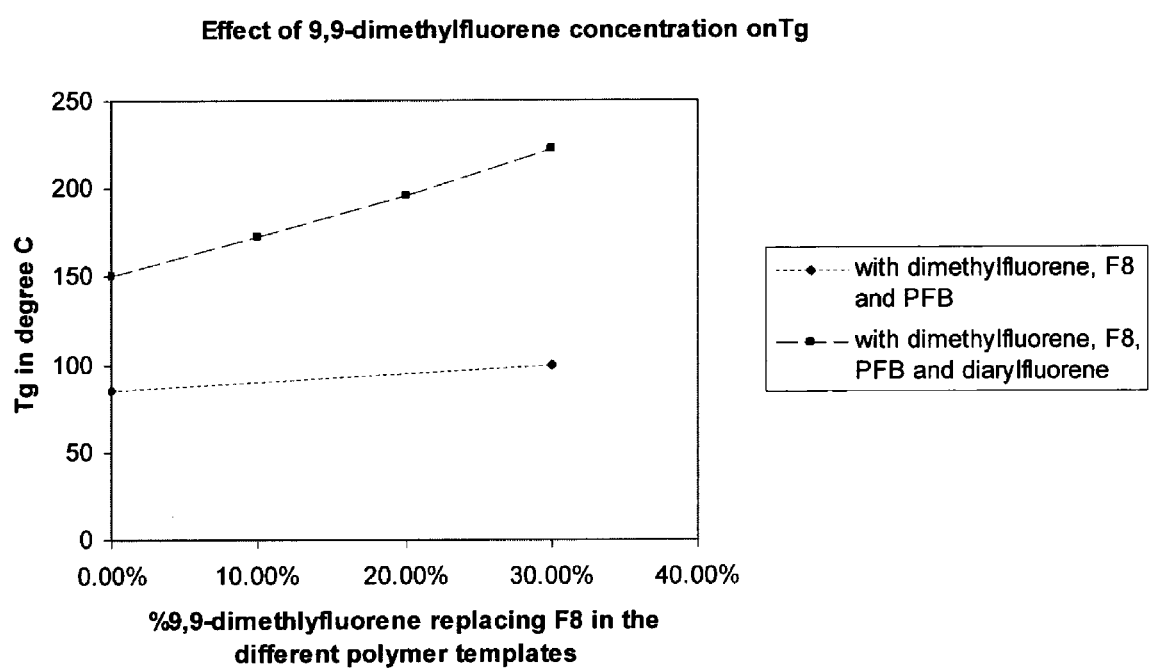
FIG. 3 shows a graph illustrating how the LUMO level of the two different polymers changes with 9,9-dimethylfluorene content.

As can be seen in FIG. 3, by increasing the proportion of 9,9-dimethylfluorene repeat unit in the opto-electrical semi-conductive polymers the LUMO level is lowered increasing the electron affinity of the polymers. This improves electron injection and thus device performance as discussed below. The LUMO level was measured using cyclic voltammetry as is known in the art.

Device Example

Onto indium tin oxide supported on a glass substrate (available from Applied Films, Colorado, USA) was deposited a layer of PEDT/PSS, available from Bayer® as Baytron P® by spin coating. A hole transporting layer comprising fluorene and triarylamine units was deposited over the PEDOT layer according to the method described in WO 2004/023573. A layer of opto-electrical semi-conductive polymer was deposited over the PEDT/PSS layer by spin-coating from xylene solution. Onto the opto-electrical semi-conductive polymer was deposited a Ba/Al cathode.

A comparison between two devices where one device included a layer of opto-electrical semi-conductive polymer according to the present invention and the other device comprised a polymer of aromatically conjugated 9,9-diethylfluorene repeat unit clearly illustrated that the half life starting at 1600 cd/m$^2$ of the polymer according to the present invention was at least 300 hrs compared to the known polymer of aromatically conjugated 9,9-diethylfluorene repeat unit where the half life starting at 1600 cd/m$^2$ was no greater than 200 hrs. The driving conditions used to generate the lifetime data were operated using a DC drive at constant current.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. A co-polymer for use in an opto-electrical device comprising aromatically conjugated repeat units of optionally substituted 9,9-dimethylfluorene and one or more different aromatically conjugated repeat units wherein the one or more different aromatically conjugated repeat units comprise optionally substituted repeat units of formula (b):

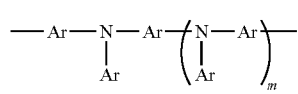

(b)

wherein each Ar is the same or different and comprises an optionally substituted aryl or heteroaryl group; m is 0, 1 or 2; and two or more aryl or heteroaryl groups may be linked by a direct bond or a divalent group.

2. A co-polymer according to claim 1, wherein the aromatically conjugated repeat units of optionally substituted 9,9-dimethylfluorene are 2,7-linked into the co-polymer as shown in Formula (a):

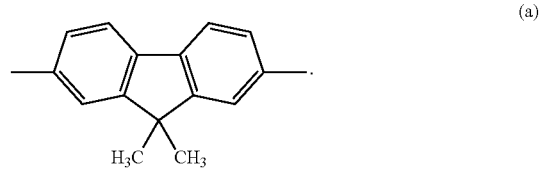

(a)

3. A co-polymer according to claim 1, wherein the aromatically conjugated repeat units of optionally substituted 9,9-dimethylfluorene are provided in the backbone of the co-polymer.

4. A co-polymer according to claim 1, wherein each Ar is optionally substituted phenyl.

5. A co-polymer according to claim 4, the repeat unit of formula (b) has a structure as shown in formula (c):

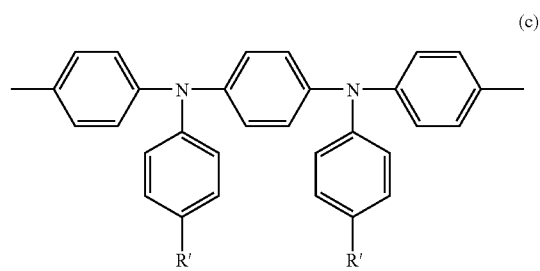

(c)

wherein each R' is independently selected from hydrogen or a solubilizing group.

6. A co-polymer according to claim 1, wherein the one or more different aromatically conjugated repeat units comprise a repeat unit of formula (d) that is optionally substituted with one or more substituents:

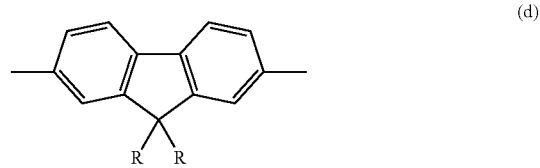

(d)

wherein each R is the same or different, and the two R groups together may form a ring and/or at least one R group may form a ring with the at least one optional substituent.

7. A co-polymer according to claim 6, wherein each R is optionally substituted phenyl.

8. A co-polymer according to claim 6, wherein each R has at least one solubilizing group thereon.

9. A co-polymer according to claim 8, wherein the solubilizing groups comprise optionally substituted $C_4$-$C_{20}$ alkyl or optionally substituted $C_4$-$C_{20}$ alkoxy groups.

10. A co-polymer according to claim 1, wherein the co-polymer is an electroluminescent co-polymer capable of emitting light in the wavelength range of RGB visible light or near infrared light.

11. An opto-electrical device comprising a first electrode, a second electrode, and a semi-conductive region located between the first and second electrodes, the semi-conductive region comprising a co-polymer according to claim 1.

12. An opto-electrical device according to claim 11, wherein the co-polymer is provided in a blended layer with other polymers, dendrimers or small molecules.

13. An opto-electrical device according to claim 11, wherein the co-polymer is provided in a layer on its own.

14. An opto-electrical device according to claim 11, wherein the co-polymer is provided in an electroluminescent layer of the semiconductive region.

15. An opto-electrical device according to claim 14, wherein the electroluminescent layer comprises one or more phosphorescent moieties, the co-polymer acting as a host for the one or more phosphorescent moieties.

16. An opto-electrical device according to claim 11, wherein the co-polymer is provided in a charge transporting layer of the semi-conductive region.

17. A co-polymer according to claim 10, wherein the emitted light wavelength range is 400 nm to 500 nm.

18. A co-polymer according to claim 1, wherein the co-polymer comprises the repeat units of optionally substituted 9,9-dimethylfluorene in an amount of greater than 0 molar percent and less than or equal to 30 molar percent.

19. A co-polymer according to claim 1, wherein the co-polymer comprises the repeat units of optionally substituted 9,9-dimethylfluorene in an amount of greater than or equal to 10 molar percent and less than or equal to 30 molar percent.

* * * * *